(12) United States Patent
Hirai et al.

(10) Patent No.: US 6,607,135 B1
(45) Date of Patent: Aug. 19, 2003

(54) MODULE FOR IC CARD, IC CARD, AND METHOD FOR MANUFACTURING MODULE FOR IC CARD

(75) Inventors: Minoru Hirai, Kyoto (JP); Shigeyuki Ueda, Kyoto (JP); Osamu Miyata, Kyoto (JP); Tomoharu Horio, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/242,750

(22) PCT Filed: Jun. 23, 1998

(86) PCT No.: PCT/JP98/02832
§ 371 (c)(1),
(2), (4) Date: Feb. 22, 1999

(87) PCT Pub. No.: WO98/59317
PCT Pub. Date: Dec. 30, 1998

(30) Foreign Application Priority Data

Jun. 23, 1997 (JP) ................................................ 9-166321
Jun. 23, 1997 (JP) ................................................ 9-166322

(51) Int. Cl.⁷ ............................................................ G06K 19/00
(52) U.S. Cl. ........................... 235/487; 235/492; 361/737
(58) Field of Search ................................ 235/487, 492, 235/488, 489; 361/728, 737, 752

(56) References Cited

U.S. PATENT DOCUMENTS

| | | | | |
|---|---|---|---|---|
| 4,463,971 A | * | 8/1984 | Hoppe et al. ................ | 235/487 |
| 4,649,418 A | * | 3/1987 | Uden .......................... | 235/487 |
| 5,027,190 A | * | 6/1991 | Haghiri-Tehrani et al. .. | 235/492 |
| 5,420,757 A | * | 5/1995 | Eberhardt et al. ........... | 361/813 |
| 5,461,256 A | * | 10/1995 | Yamada et al. .............. | 257/679 |
| 5,572,408 A | * | 11/1996 | Anhalt et al. ................ | 361/737 |
| 5,654,693 A | * | 8/1997 | Cocita ......................... | 340/572 |
| 5,719,746 A | * | 2/1998 | Ohbuchi et al. ............. | 361/737 |
| 5,818,699 A | * | 10/1998 | Fukuoka ..................... | 361/760 |
| 5,852,289 A | * | 12/1998 | Masahiko .................... | 235/492 |
| 6,095,423 A | * | 8/2000 | Houdeau et al. ............ | 235/487 |

FOREIGN PATENT DOCUMENTS

| | | | | |
|---|---|---|---|---|
| DE | 19632813 | * | 8/1996 | ......... G06K/19/077 |
| JP | 63-37998 | | 2/1988 | |
| JP | 63-78796 | | 4/1988 | |

OTHER PUBLICATIONS

International Search Report in PCT/JP98/02832.

* cited by examiner

Primary Examiner—Daniel St. Cyr
(74) Attorney, Agent, or Firm—Merchant & Gould, P.C.

(57) ABSTRACT

An IC-card module (A) to be incorporated in an IC-card (B) includes a substrate (1), an IC chip (2) mounted on the substrate, and a protective member (4) bonded to the substrate (1) to cover the IC chip (2). A clearance (S) is provided between the protective member (4) and the IC chip (2) for avoiding direct contact of the protective member (4) with the IC chip (2). The clearance (S) is loaded with a filler (6) having a low modulus of elasticity, as required. The protective member (4) includes a reinforcing member (8).

25 Claims, 16 Drawing Sheets

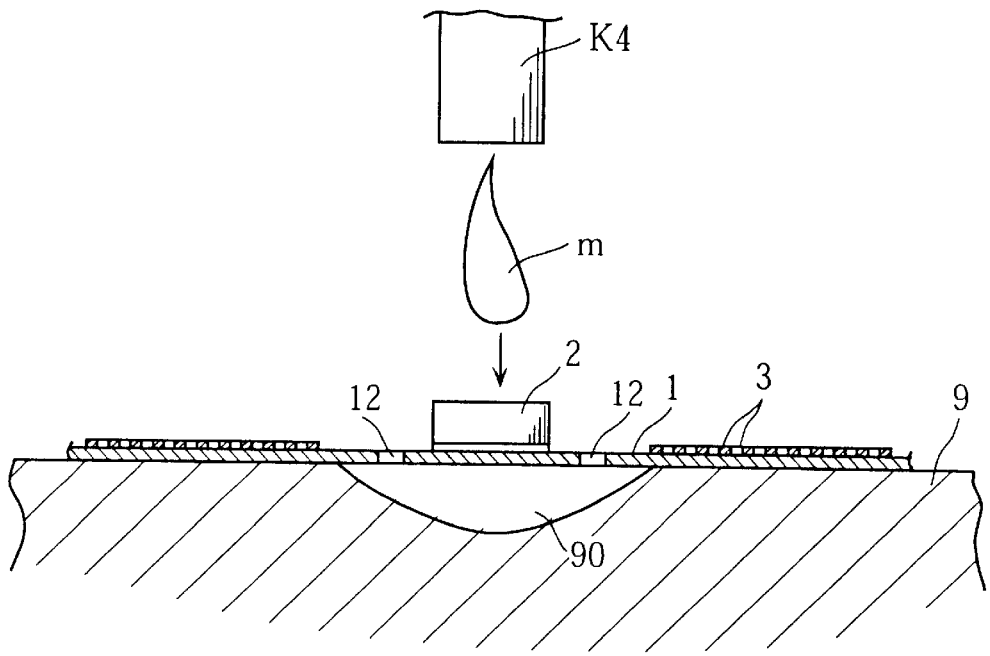
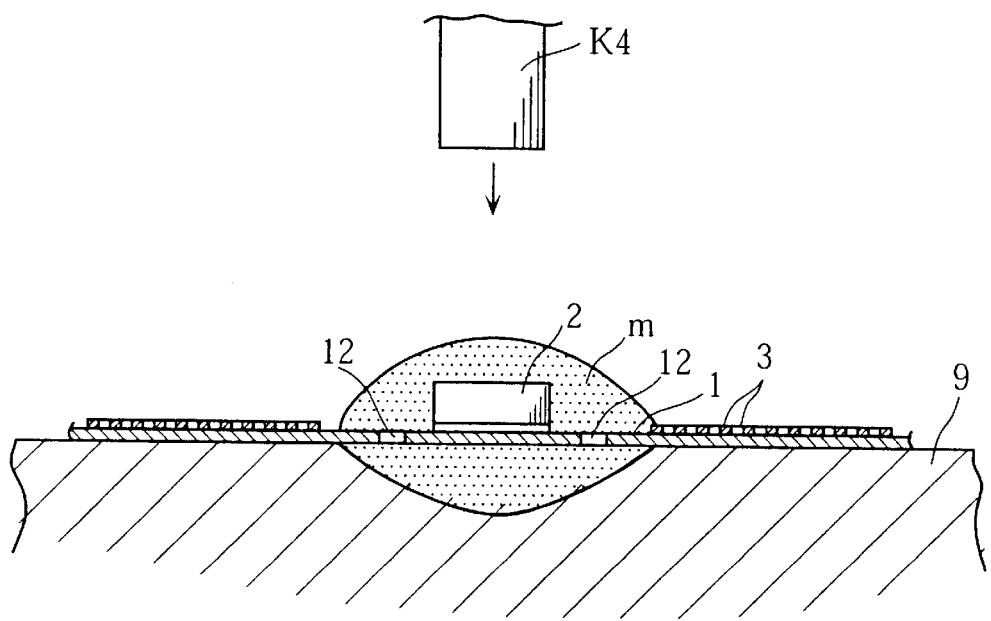

MODULE FOR IC CARD, IC CARD, AND METHOD FOR MANUFACTURING MODULE FOR IC CARD

TECHNICAL FIELD

The present invention relates to an IC-card module which is a component of an IC-card for use as an identification card or the like. It also relates to an IC-card having such a module and a method of making an IC-card module.

BACKGROUND OF THE INVENTION

An IC-card having an IC memory is known as a card having an information storage function. Recently, a non-contact type IC-card has been in practical use as a prepaid card for use of ski lifts or the like. Such an IC-card includes an IC chip incorporated in a card member made of a synthetic resin. More specifically, the IC-card comprises an IC-card module which is incorporated in a card member made of a synthetic resin and having a predetermined thickness, and the IC-card module comprises an electronic circuit including an IC memory and an antenna coil. The IC-card module may include a small battery as a power source or a capacitor for storing electric power supplied via the antenna coil in a non-contact manner.

When the antenna coil in the IC-card receives radio waves transmitted from a predetermined transmitter/receiver, it generates an electromotive force due to electromagnetic induction. The electromotive force is utilized to wirelessly transmit signals representative of the remaining number of times of ski lifts from the antenna coil to the transmitter/receiver. When the transmitter/receiver responds by wirelessly sending a signal for reducing the remaining number of times by one, the data in the IC memory are renewed in response to the signal.

Thus, an IC-card is suitable for use as a non-contact type information storage card. Further, the information storage capacity of an IC-card can be easily increased, and a counterfeit of the card can be effectively prevented. Accordingly, there is a demand for development of an IC-card as a portable information carrier having a high information processing ability and communicating ability.

Moreover, there is also an increasing demand for thickness reduction of an IC-card. Therefore, there is a higher possibility of deforming the IC-card when it is handled by a user. Since the IC-card incorporates an IC chip, a significant stress is likely to be applied to the IC chip when subjected to deformation. Such a situation poses problems such as detachment of the IC chip from the wiring pattern or damage to the IC chip itself. In particular, damage to the IC chip itself may cause an inconvenience that the data stored in the IC chip are lost and become difficult to recover.

DISCLOSURE OF THE INVENTION

It is an object of the present invention to provide an IC-card module and an IC-card which are capable of solving or lessening the above problems.

Another object of the present invention is to provide a method of making an IC-card module.

In accordance with a first aspect of the present invention, there is provided an IC-card module comprising a substrate, and an IC chip mounted on the substrate, wherein a protective member is bonded to the substrate to cover the IC chip, and wherein a clearance is provided between the protective member and the IC chip for avoiding direct contact of the protective member with the IC chip.

Preferably, the substrate may comprise a flexible synthetic resin film as a base material.

Preferably, the substrate may be provided with an antenna coil for radio communication of electrical signals processed by the IC chip.

Preferably, the protective member may comprise a protective cap in the form of a plate or a sheet formed with a recess on a surface thereof opposed to the substrate for housing the IC chip.

Preferably, the protective cap may be formed by molding a resin.

Preferably, the protective cap may comprise a first sheet member having a through-hole, and a second sheet member separate from the first sheet member, the second sheet being laminated and bonded to the first sheet member, an opening of the through-hole being closed by the second sheet member to provide the recess.

Preferably, the protective member may comprise a resin-package enclosing the IC chip with a clearance formed between the resin-package and the IC chip.

Preferably, the protective member may cover opposite surfaces of the substrate at a portion thereof on which the IC chip is mounted, a clearance being formed between each surface of the substrate and the protective member.

Preferably, the clearance between the protective member and the IC chip may be loaded with a filler having a modulus of elasticity lower than that of the protective member.

Preferably, the filler may comprise a material such as polyvinyl acetate resin emulsion adhesive which is curable at room temperature.

Preferably, the clearance between the protective member and the IC chip may be held in an oxygen-free atmosphere.

Preferably, the clearance may be filled with an inert gas.

Preferably, the IC-card module may further comprise a reinforcing member which is harder than the protective member for reinforcing the protective member around the IC chip.

Preferably, the protective member may be formed of a metal or a ceramic material.

In accordance with a second aspect of the present invention, there is provided an IC-card comprising an IC-card module which includes: a substrate, an IC chip mounted on the substrate, and a protective member bonded to the substrate to cover the IC chip, a clearance being provided between the protective member and the IC chip for avoiding direct contact of the protective member with the IC chip; wherein the IC-card module is incorporated in a card member.

Preferably, the card member may comprise a card body having a receiving portion in the form of a recess or a through-hole for housing the IC-card module, and at least one cover sheet bonded to the card body to close an opening of the receiving portion.

In accordance with a third aspect of the present invention, there is provided a method of making an IC-card module comprising: a first step of covering an IC chip mounted on a substrate with a covering material, and a second step of packaging the IC chip in a resin package over the covering material, wherein the second step includes liquefying or gasifying the covering material for penetration into the resin-package before the resin-package is cured so that a clearance is formed between the resin package and the IC chip.

Preferably, the first step may include covering, with the covering material, opposite surfaces of the substrate at a portion thereof on which the IC chip is mounted, the second step including resin-packaging the opposite surfaces of the substrate at the chip mounting portion so that a clearance is defined between each surface of the substrate and the resin package.

Preferably, the substrate may have a though-hole formed in advance, and the first step includes supplying the covering material in a fluid state to an obverse surface of the substrate and causing the covering material to flow through the through-hole to a reverse surface of the substrate so that the covering material is applied to both of the opposite surfaces of the substrate at the chip mounting portion.

In accordance with a fourth aspect of the present invention there is provided an IC-card module comprising a substrate, and an IC chip mounted on the substrate, wherein the module further comprises a protective member bonded to the substrate to cover the IC chip, and a reinforcing member which is harder than the protective member for reinforcing the protective member around the IC chip.

Preferably, the protective member may be formed of a synthetic resin, and the reinforcing member may be formed of a metal or a ceramic material.

Preferably, the protective cap may be formed by molding a resin, and the reinforcing member may be embedded in the protective member by insert molding.

Preferably, the protective member may be provided with a recess for housing the IC chip, and the reinforcing member may include a ring-like member or a ring-like portion fitted in the recess to surround the IC chip.

Preferably, the IC-card module may further comprise an antenna coil formed of a metal wire electrically connected to the IC chip, the antenna coil having a plurality of winding bundles of the metal wire having different winding diameters, wherein a diametrically smaller one of the winding bundles is disposed adjacent the IC chip to surround the IC chip for serving as the reinforcing member.

Preferably, the IC chip and the antenna coil may be packaged in a common resin package.

In accordance with a fifth aspect of the present invention, an IC-card is provided which comprises an IC-card module which includes a substrate, an IC chip mounted on the substrate, a protective member bonded to the substrate to cover the IC chip, and a reinforcing member which is harder than the protective member for reinforcing the protective member around the IC chip; wherein the card member incorporates an IC-card module.

Various features and advantages of the present invention will become clearer from the description given below with reference to the accompanying drawings.

BRIEF DESCRIPTION OF THE DRAWINGS

FIG. 16 is a sectional view showing a step of fabricating the IC-card module shown in FIG. 15.

FIG. 17 is a sectional view showing another step of fabricating the IC-card module shown in FIG. 15.

BEST MODE FOR CARRYING OUT THE INVENTION

The present invention will be now described in detail with reference to the accompanying drawings.

Figure 1:
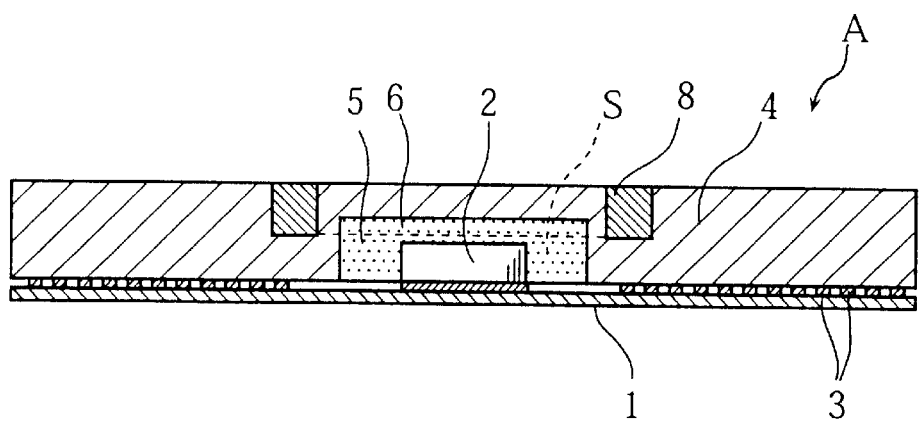
FIG. 1 is a sectional view showing an example of IC-card module embodying the present invention.
Figure 2:
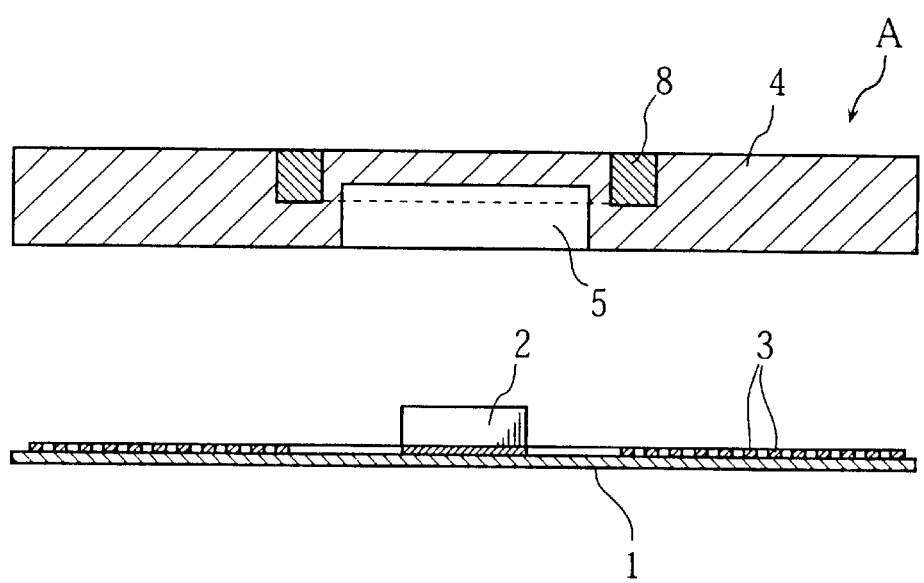
FIG. 2 is an exploded sectional view of the IC-card module shown in FIG. 1.

Referring to FIGS. 1 and 2, an IC-card module A embodying the present invention comprises a flexible substrate 1, an IC chip 2, an antenna coil 3, a protective cap 4 and a reinforcing member 8.

The flexible substrate 1 may comprise a thin flexible synthetic resin film such as polyimide film as a base material. The flexible substrate is circular in plan view and has a thickness of, for example, 0.1 mm.

Figure 3:
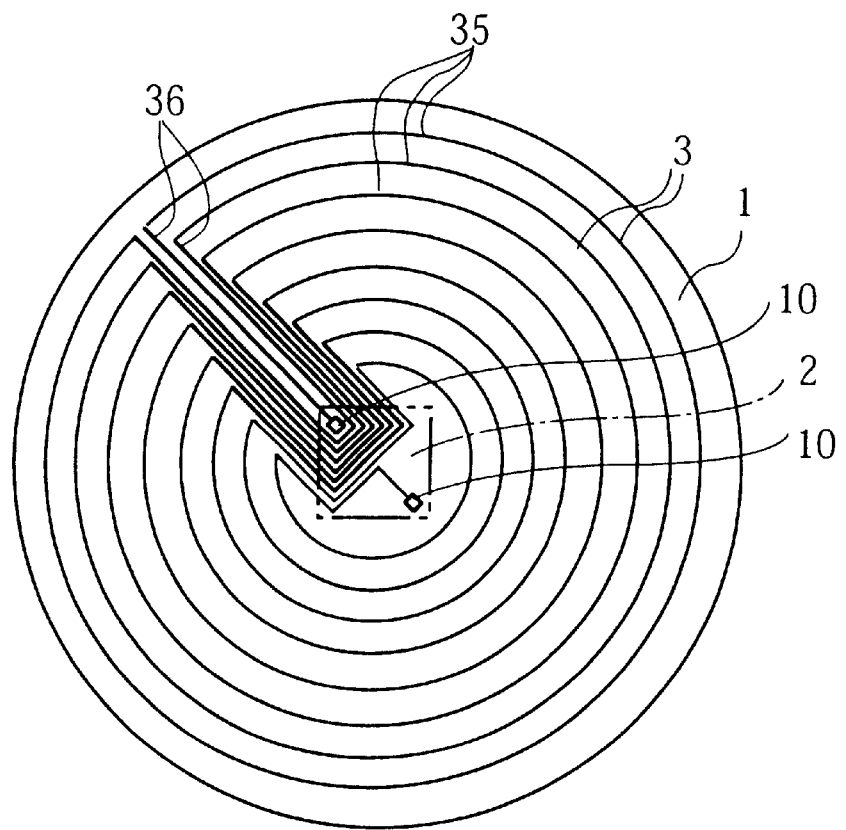
FIG. 3 is a plan view showing a substrate and an antenna coil constituting the IC-card module shown in FIG. 1.

The antenna coil 3 is provided on a surface of the flexible substrate 1. The antenna coil 3 may be formed by etching, into a predetermined pattern, a conductive layer such as a copper foil applied on the flexible substrate 1. As shown in FIG. 3, the antenna coil 3 includes a vortex portion 35 generally concentric with the outer shape of the substrate 1, and an extension 36 extending from the vortex portion 35 toward the center thereof. The extension 36 of the antenna coil 3 extends in a non-shorting manner between two lands 10 which are disposed at the center of the flexible substrate 1. The extension 36 includes a starting end and a terminating end of the antenna coil 3 held in connection to the lands 10, respectively. The antenna coil 3 serves as a device for transmitting and receiving radio waves (electromagnetic waves) to and from a transmitter/receiver. When the antenna coil 3 receives radio waves, it generates an electromotive force by electromagnetic induction for supply to the IC chip 2. Conversely, when the IC chip outputs signals, the antenna coil generates radio waves corresponding to the signals.

Figure 4:
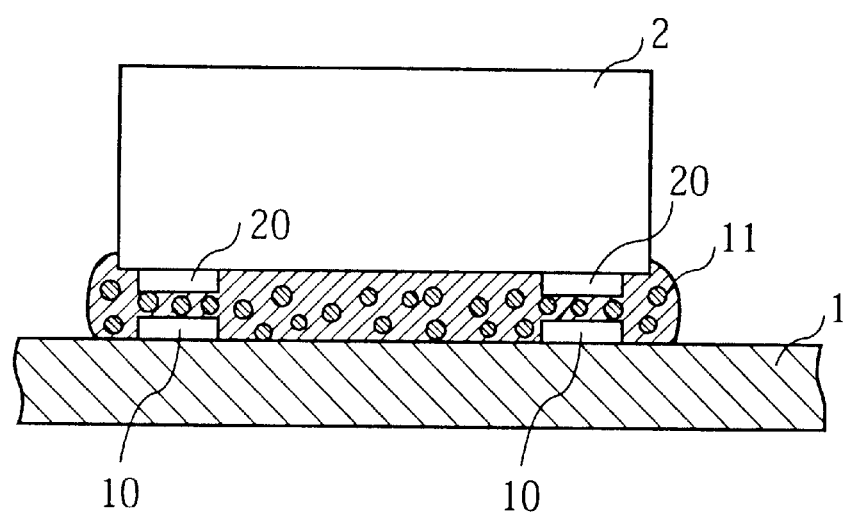
FIG. 4 is an enlarged sectional view showing a principal portion at which an IC chip is mounted.

The IC chip 2, mainly for use as a memory having an information storage function, is driven by the electromotive force induced by the antenna coil 3. As clearly shown in FIG. 4, the IC chip 2 has a principal surface (active surface) provided with electrodes 20 bonded to the respective lands 10 via an anisotropic conductive film 11. The anisotropic conductive film 11 is made of an adhesive insulating resin containing conductive metal particles dispersed therein. When the anisotropic conductive film 11 is compressed between the electrode 20 and the land 10 with a predetermined pressure, the density of the metal particles in the compressed portion increases. As a result, electric conduction is provided only between the electrode 20 and the land 10.

The protective cap 4 shown in FIG. 1 is an example of protective member in accordance with the present invention. The protective cap 4 is made of a resin molded into a plate which is circular in plan view, and generally coincides in size with the substrate 1. The protective cap 4 has a recess 5 formed on a surface thereof. The protective cap 4 is formed of e.g. polyethylene terephthalate (hereinafter abbreviated as PET) or acrylonitrile-butadiene-styrene resin (hereinafter abbreviated as ABS resin), and has a thickness of about 0.35 mm for example. The protective cap 4 is laid over and adhered to a surface of the flexible substrate 1 with the recess 5 oriented downward. Thus, the IC chip 2 is housed in the recess 5 and covered by the protective cap 4. It is to be noted that the recess 5 is formed larger than the IC chip 2 so that a clearance S is provided between the IC chip 2 and the opposed inner walls of the recess 5.

The clearance S is loaded with a filler 6, which may be a silicone resin for example. The filler 6 is loaded in the recess in a fluid state and then cured under heating or at room temperature into an elastomeric state. The filler is softer than the protective cap 4; the modulus of elasticity of the filler after the curing is smaller than that of the protective cap.

The reinforcing member 8 comprises a ring made of a metal or ceramic material which is harder than the protective cap 4. The reinforcing member 8 is disposed so as to surround the IC chip 2 and the recess 5 in plan view, and is embedded in an upper portion of the protective cap 4 by insert molding.

Next, the structure of an IC-card B provided with the above-mentioned IC-card module A will be described with reference to FIGS. 5 to 7.

Figure 5:
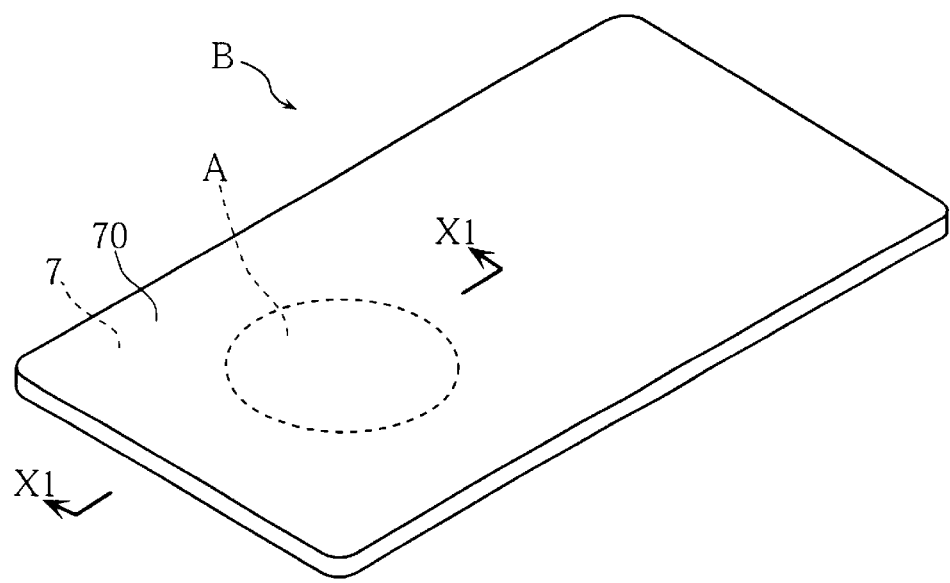
FIG. 5 is a perspective view showing an example of IC-card incorporating the IC-card module embodying the present invention.

Referring to FIG. 5, the IC-card B is rectangular in plan view and has an overall thickness of about 0.76 mm for example. As clearly shown in FIG. 7, the IC-card B incorporates a card body 7, two cover sheets 70, 71, and the IC-card module A.

The card body 7 is formed of a synthetic resin such as PET or polyvinyl chloride (hereinafter abbreviated as PVC) and has a thickness of about 0.45 mm. The IC-card module A is similar in thickness to the card body 7. The card body 7 is formed with a receiving portion 72 in the form of a through-hole for receiving the IC-card module A.

Each of the cover sheets 70, 71 is configured so as to conform to the card body 7 in plan view and has a thickness of about 0.15 mm for example. Similarly to the card body 7, the cover sheets 70, 71 are formed of a synthetic resin such as PET or PVC. The cover sheets 70, 71 are respectively bonded to the opposite surfaces of the card body 7 after the IC-card module A is housed in the receiving portion 72. Accordingly, the receiving portion 72 is upwardly and downwardly closed by the cover sheets 70, 71, respectively, thereby enclosing the IC-card module A in the receiving portion 72. It is to be noted that the aforesaid overall thickness value of the IC-card includes the thickness of adhesive layers for bonding the cover sheets 70, 71 to the card body 7.

Figure 8:
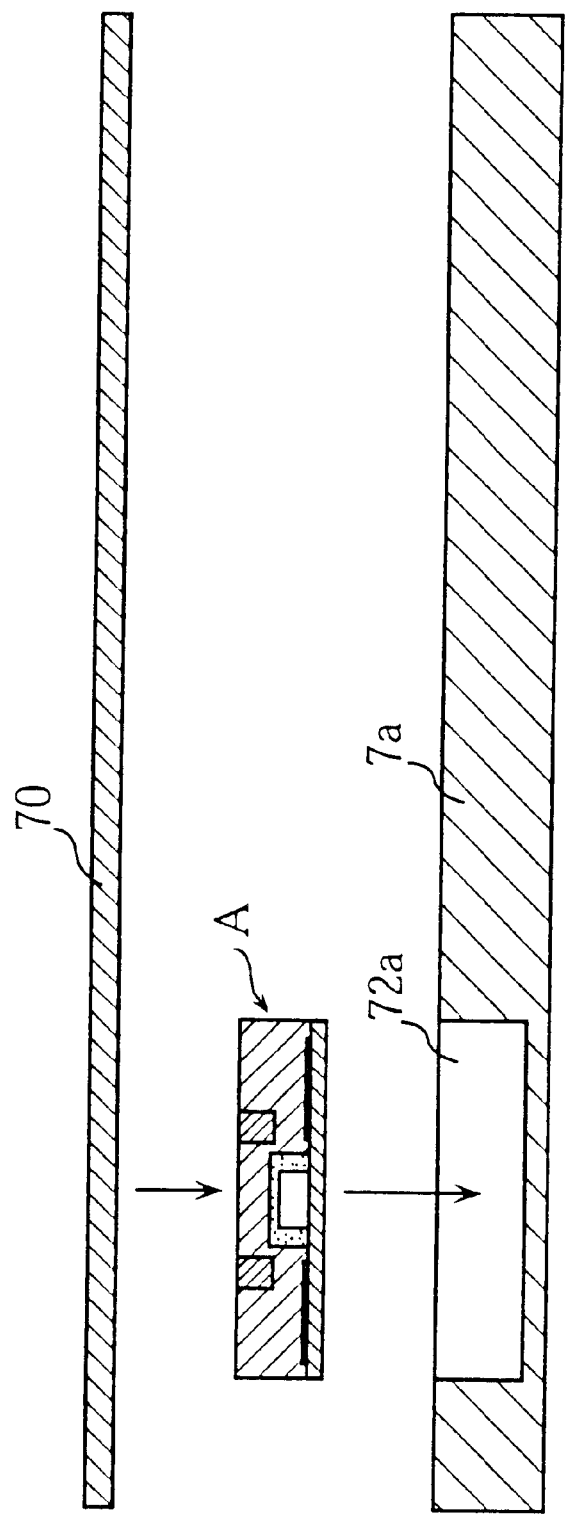
FIG. 8 is an exploded sectional view showing another example of IC-card.

According to the present invention, the IC-card module A may be incorporated in the IC-card, as shown in FIG. 8. As shown in this figure, a card body 7a is formed with a receiving portion 72a in the form of a bottomed recess for receiving the IC-card module A. With such a means, only a single cover sheet 70 needs to be bonded to the card body 7a for enclosing the IC-card module A within the receiving portion 72a. Thus, the number of the components of the IC-card can be decreased.

Next, the operation of the IC-card B will be described.

Figure 6:
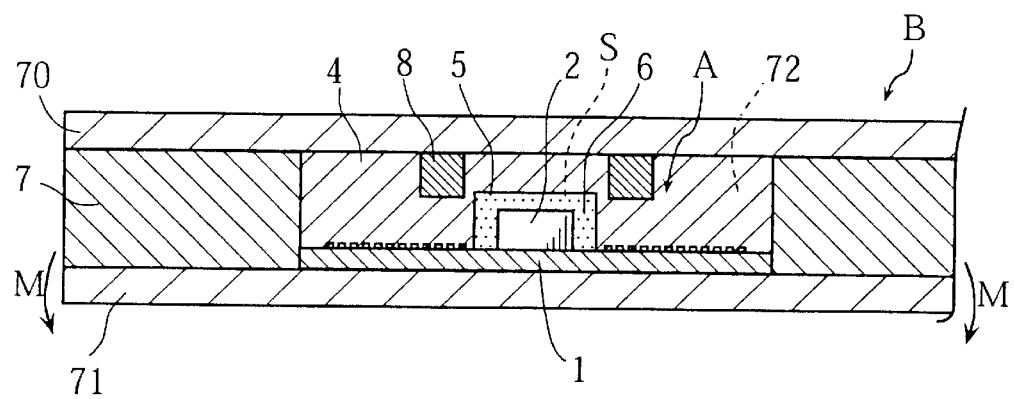
FIG. 6 is a sectional view taken along lines X1—X1 in FIG. 5.
Figure 7:
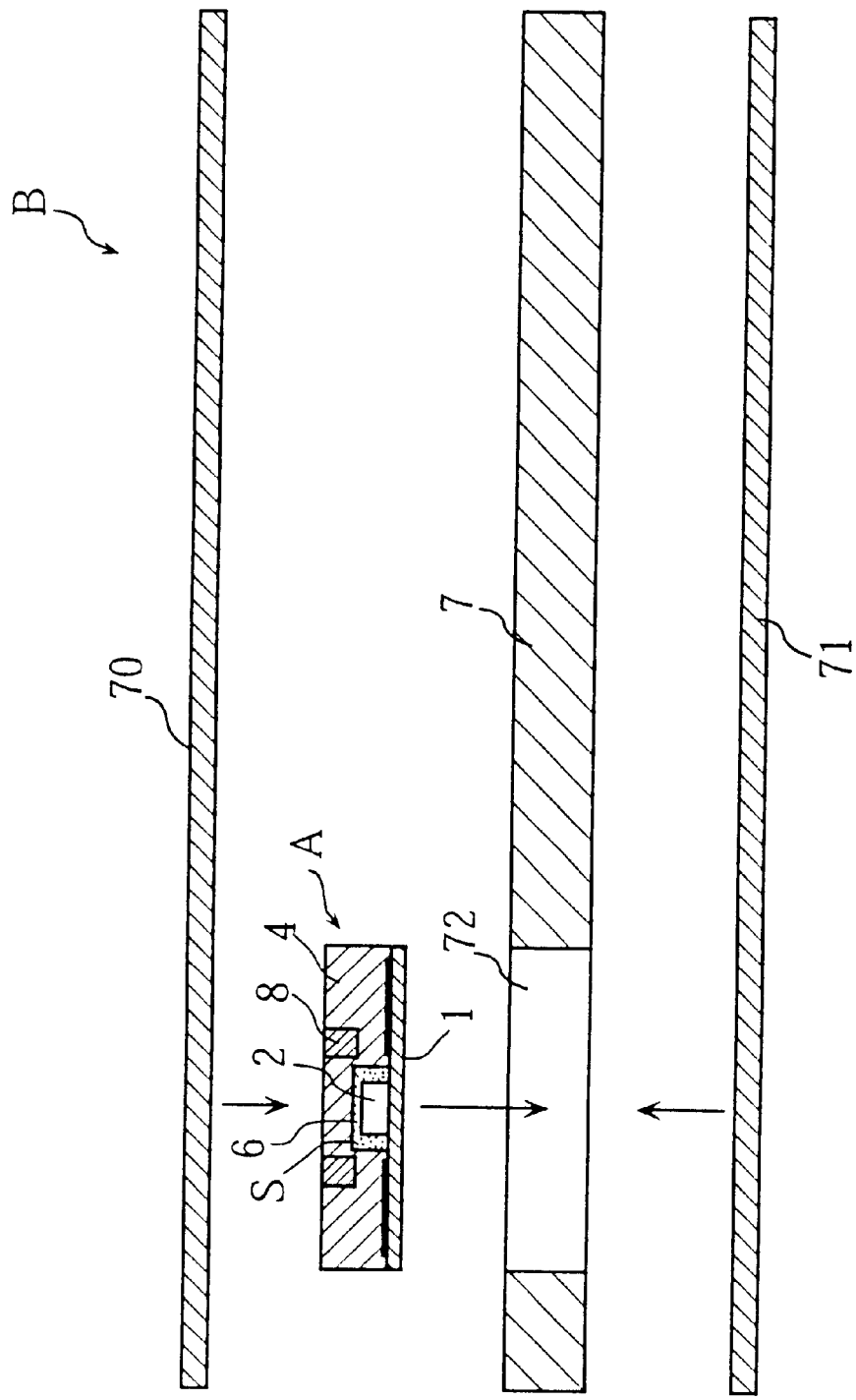
FIG. 7 is an exploded sectional view of the IC-card shown in FIG. 5.

When the IC-card B is handled by a user, a bending force M may be applied on a peripheral portion of the IC-card module A, as shown in FIG. 6. However, since the protective cap 4 is reinforced by the reinforcing member 8, the reinforced portion is not easily deformed by the bending force M. Particularly, since the reinforcing member 8 is provided in such a manner as to surround the IC chip 2 in plan view, the protective cap 4 is less likely to deform near the IC chip 2. As a result, it is possible to avoid a significant damage to the IC chip 2 due to the great deformation of the protective cap 4.

Since the reinforcing member 8 is embedded in the protective cap 4B by insert molding, the reinforcing member 8 and the protective cap 4b can be assembled easily and reliably. Further, the reinforcing member 8 is provided so as not to protrude outwardly from the protective cap 4B, which contributes to a thickness reduction of the IC-card module A. Furthermore, owing to the ring-shape of the reinforcing member 8, the portion adjacent the IC chip 2 can be reinforced efficiently without greatly increasing the total weight of the reinforcing member 8.

The protective cap 4 is held only in indirect contact with the IC chip 2 via the soft filler 6 having a low modulus of elasticity. Accordingly, even if the protective cap 4 is deformed to some extent, the deforming stress to the protective cap 4 does not directly affect the IC chip 2. Thus, since the filler 6 absorbs and buffers a force to be transmitted from the protective cap 4 to the IC chip 2, the IC chip 2 is prevented from suffering a significant damage. Even when a mechanical shock from outside is applied to a surface of the IC-card B, the filler 6 functions to absorb and buffer the shock, thereby preventing the shock from being transmitted directly to the IC chip 2. As a result, the IC chip 2 can be effectively protected, which prevents or lessens a disadvantage such as a loss of the data stored in the IC chip 2.

Since the IC chip 2 is enclosed in the filler 6, the metal wirings of the IC chip 2 can be prevented from getting in contact with the outside air. Accordingly, the wirings can be prevented from suffering oxidation or corrosion, which is advantageous for prolonging the life of the IC chip 2.

According to the present invention, the filler 6 may be formed of a polyvinyl acetate resin emulsion adhesive instead of a silicone resin. The polyvinyl acetate resin emulsion adhesive is generally used as a woodwork bond, and has, in a dried solid state, a modulus of elasticity considerably lower than PET or ABS resin, thereby providing a stress buffering function similarly to silicone resin. Moreover, the filler of a polyvinyl acetate resin emulsion adhesive maybe readily cured at room temperature. Accordingly, the use of such a filler obviates the need for heating the IC-card module at a high temperature, which is favorable for an IC chip incorporating components which are susceptible to thermal damage.

Figure 9:
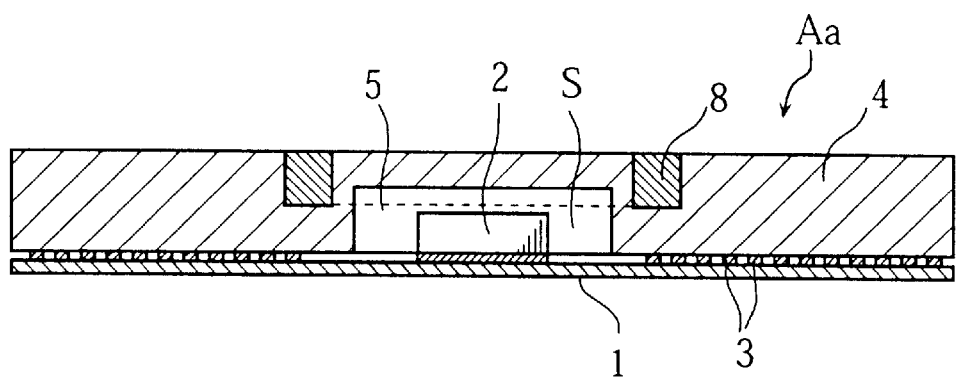
FIG. 9 is a sectional view showing a further example of IC-card module embodying the present invention.

Other embodiments of the IC-card module in accordance with the present invention will be described with reference to FIG. 9 and the subsequent figures. In FIG. 9 and the subsequent figures, the components which are identical or similar to those of the foregoing embodiment are designated by the same reference signs.

Referring to FIG. 9, an IC-card module Aa is shown in which a recess 5 in a protective cap 4 is not loaded with a filler but is filled with an inert gas such as nitrogen. Filling of the inert gas into the recess 5 may be performed by bonding the protective cap 4 and the flexible substrate 1 in an inert atmosphere. The inert gas can be appropriately enclosed in the recess 5 by rendering the protective cap 4 and the flexible substrate 1 hermetic at the bonded surfaces.

Since the protective cap 4 and the IC chip 2 are not in direct contact with each other in the IC-card module Aa, the bending stress on the protective cap 4 is not directly transmitted to the IC chip 2 even if the protective cap 4 is deformed, thereby protecting the IC chip 2. Further, since the IC chip 2 is held in an inert atmosphere, the metal wirings of the IC chip 2 can be prevented from oxidation or corrosion.

Thus, in accordance with the present invention, the clearance between the IC chip 2 and the protective cap 4 may not necessarily be loaded with a filler. In the case where prevention of oxidation or corrosion of the wirings of the IC chip 2 need not be considered, only air may exist within the clearance S.

Figure 10:
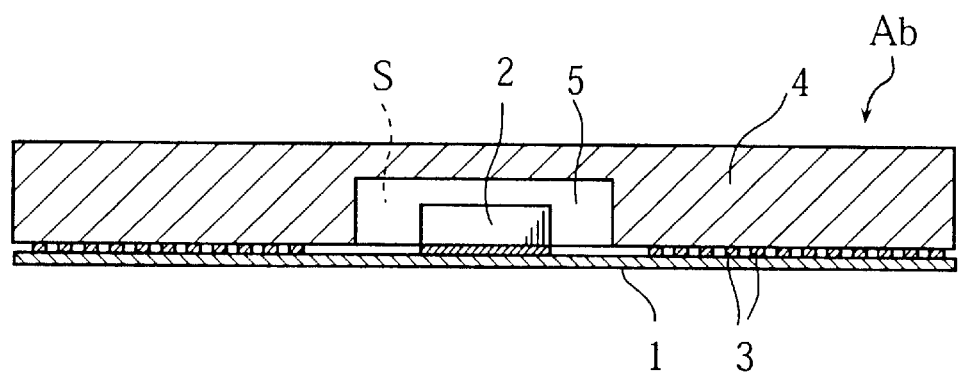
FIG. 10 is a sectional view showing still another example of IC-card module embodying the present invention.

Referring to FIG. 10, an IC-card module Ab is shown which is not provided with a reinforcing member 8. By the provision of a clearance S between an IC chip 2 and a protective cap 4, the IC chip 2 can be prevented from being directly damaged even if the protective cap 4 is deformed to some extent, and hence, the reinforcing member 8 may be dispensed with.

Figure 11:
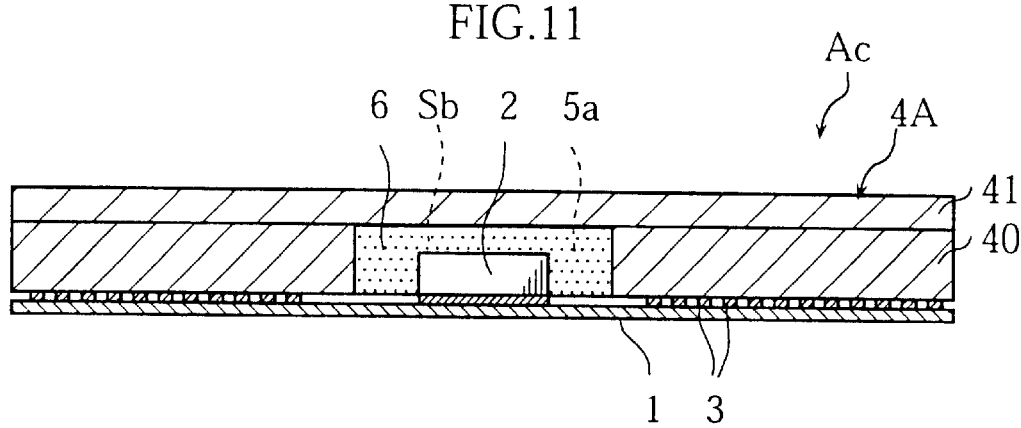
FIG. 11 is a sectional view showing a further example of IC-card module embodying the present invention.
Figure 12:
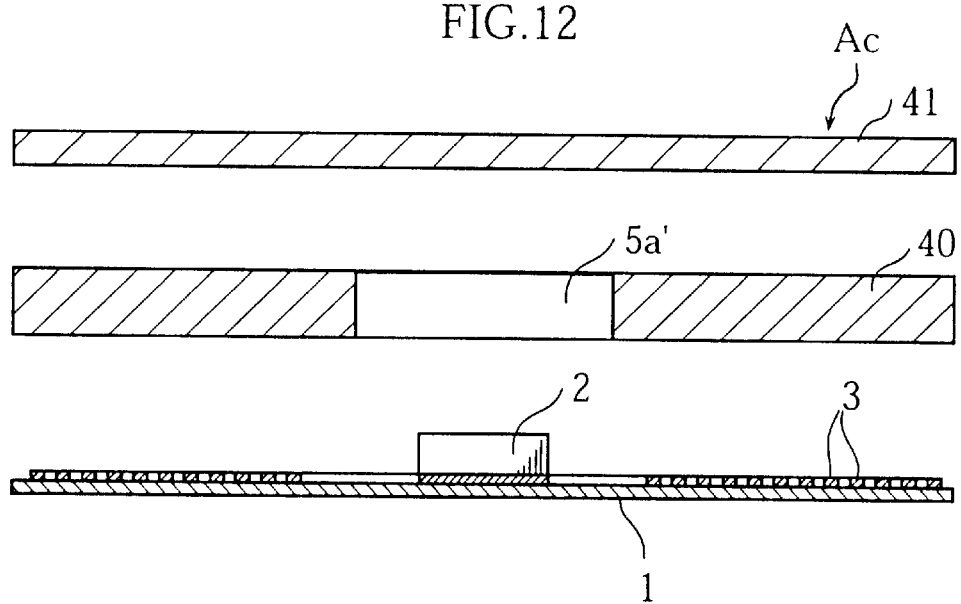
FIG. 12 is an exploded sectional view of the IC-card module shown in FIG. 11.

Referring to FIG. 11, an IC-card module Ac is shown which is provided with a protective cap 4A comprising a first sheet member 40 and a second sheet member 41. The first sheet member 40 is formed of e.g. PET or ABS resin, and has a thickness of about 0.25 mm for example. As better shown in FIG. 12, the first sheet member 40 is formed with a through-hole 5a'. The second sheet member 41 is formed of e.g. PET, and has a thickness of about 0.1 mm for example. The first sheet member 40 and the second sheet member 41 are mutually laminated and bonded so that an opening of the through hole 5a' of the first sheet member 40 is closed by the second sheet member 41, thereby forming a recess 5a for housing the IC chip 2. The clearance Sb around the IC chip 2 is loaded with a filler 6.

Figure 13:
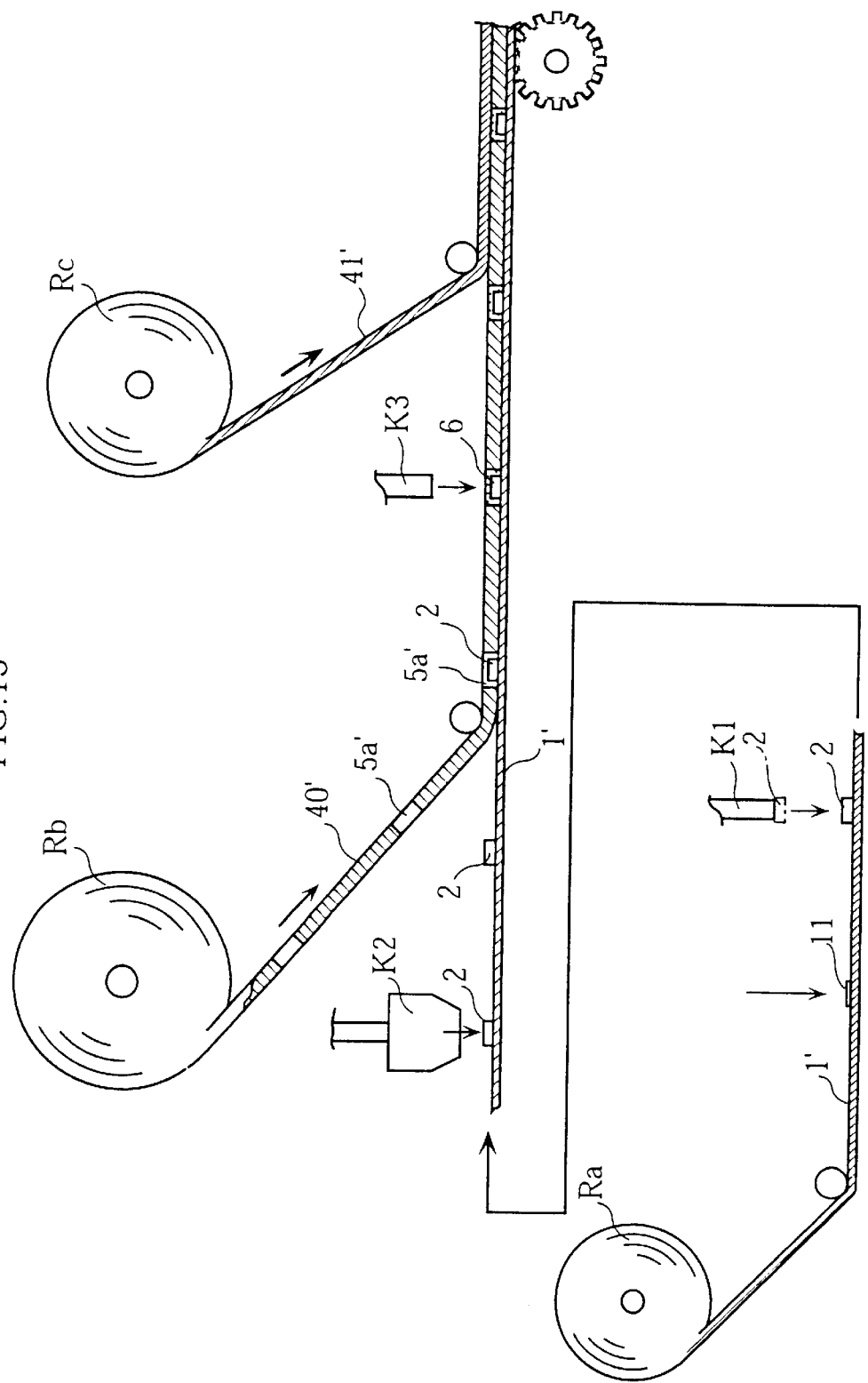
FIG. 13 is a view showing a process of fabricating the IC-card module shown in FIG. 11.

As shown in FIG. 13, in manufacturing the IC-card module Ac, a ribbon of first sheet member 40' and a ribbon of second sheet member 41' respectively fed from rolls Rb, Rc thereof are successively superposed over and bonded to a ribbon of flexible substrate 1' fed from a roll Ra thereof while advancing along a predetermined transfer path.

More specifically, IC chip 2 are mounted on the ribbon of flexible substrate 1' before the ribbon of first sheet member 40' is superposed over the ribbon of flexible substrate 1'. In this process step which is performed after an anisotropic conductive film 11 is provided on the flexible substrate 1', each IC chip 2 is mounted on the anisotropic conductive film 11 by the use of a chip mounter K1. Subsequently, the IC chip 2 is appropriately pressed by a heating press K2 so as to establish conduction between the electrode of the IC chip 2 and the land of the flexible substrate 1'. The subsequent superposing of the ribbon of first sheet member 40' over the ribbon of flexible substrate 1' is performed in a manner such that the IC chip 2 is housed in a respective through-hole 5a' formed in the ribbon of first sheet member 40'. After the IC chip 2 is housed in the through-hole 5a', the filler 6 is loaded in the through-hole 5a' with the use of a filling apparatus K3. Then, the ribbon of second sheet member 41' is superposed over and bonded to the first sheet member 40'.

These successive steps provide a ribbon laminate comprising the ribbon of flexible substrate 1', the ribbon of first sheet member 40' and the ribbon of second sheet member 41' bonded to each other. By subsequently punching the ribbon laminate into a circular shape or the like, IC-card modules are obtained in succession. In this way, the successive steps employing such a ribbon laminate enhance the efficiency of fabricating IC-card modules.

Figure 14:
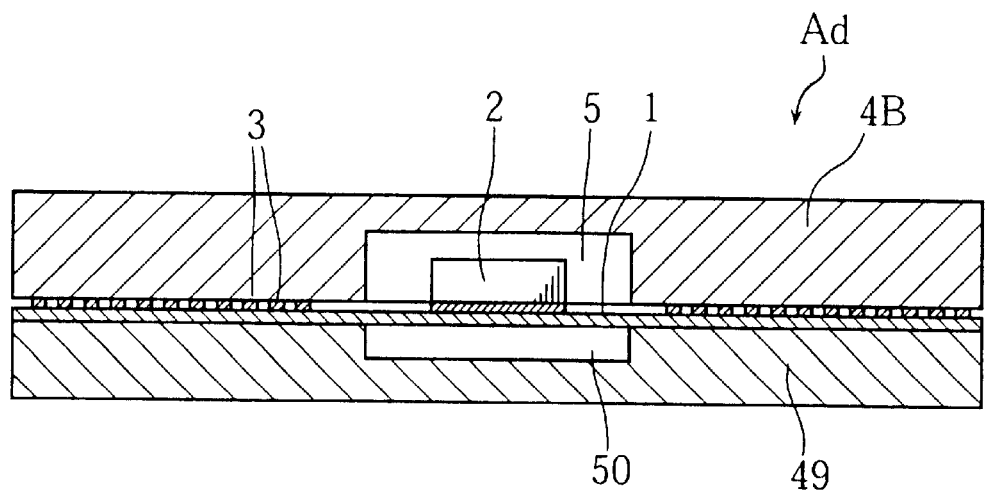
FIG. 14 is a sectional view showing still another example of IC-card module embodying the present invention.

Referring to FIG. 14, an IC-card module Ad is shown which comprises a flexible substrate 1, a protective cap 4B bonded to an obverse surface of the flexible substrate 1, and a protective cover 49 bonded to a reverse surface of the flexible substrate 1. The protective cover 49 is formed with a recess 50 confronting a recess 5 in the protective cap 4B via the flexible substrate 1. Thus, the opposite surfaces of the flexible substrate 1 are supported by the protective cap 4B and the protective cover 49, respectively, with the chip bonding portion held out of contact therewith due to the clearances.

With such a structure, since forces applied from above and below the substrate 1 are equally buffered by the protective cap 4B and the protective cover 49, the IC cap 2 can be protected even more appropriately. Further, since the reverse surface of the flexible substrate 1 is not held in contact with the protective cover 49 at the portion where the IC chip 2 is mounted, the IC chip 2 does not suffer a significant damage due to contact with the protective cover 49.

Figure 15:
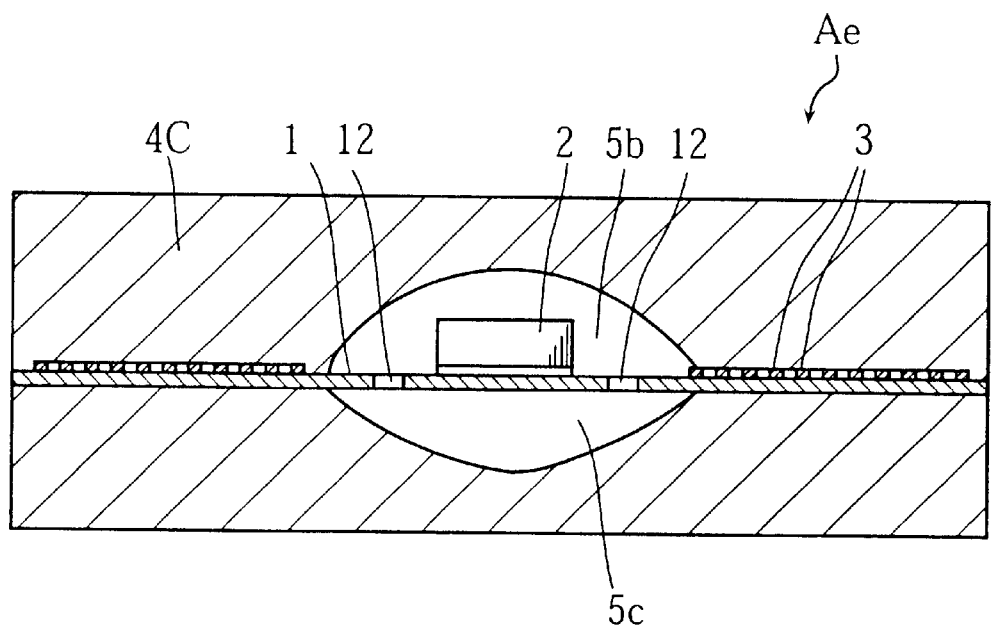
FIG. 15 is a sectional view showing still another example of IC-card module embodying the present invention.

Referring to FIG. 15, an IC-card module Ae is shown wherein an IC chip 2 mounted on a flexible substrate 1 is housed in a resin package 4C. The resin package 4C may be made of a phenolic resin for example. The resin package 4C is formed with a pair of hollow portions 5b, 5c confronting with each other via the flexible substrate 1. A clearance is provided between the IC chip 2 disposed within the hollow portions 5b, 5c and the resin package 4C.

Figure 18:
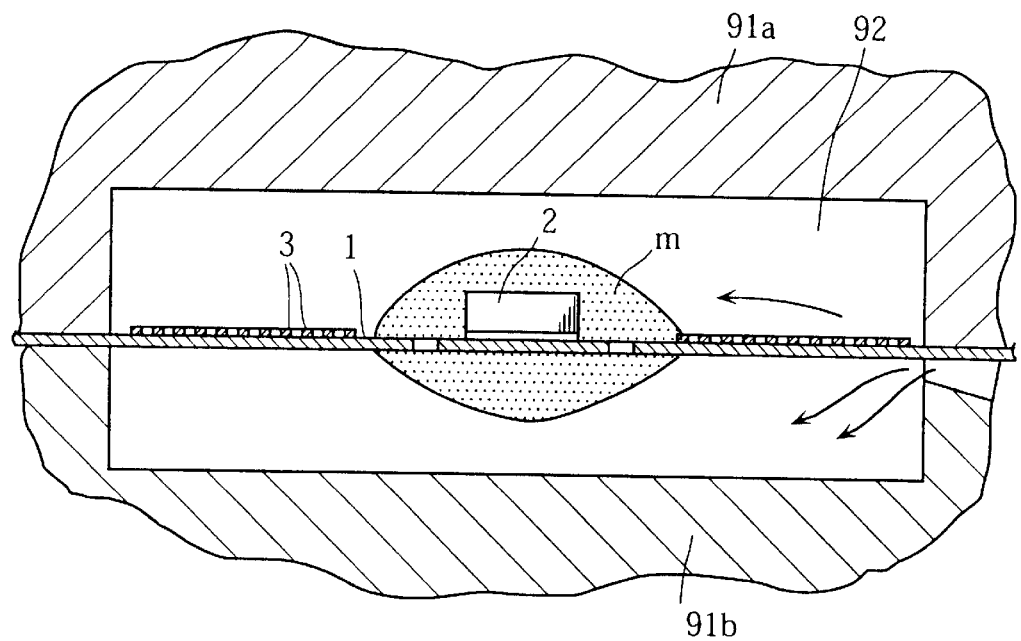
FIG. 18 is a sectional view showing a further step of fabricating the IC-card module shown in FIG. 15.

The IC chip 2 maybe resin-packaged in the following manner. As shown in FIG. 16, a flexible substrate 1 provided with an IC chip 2 is disposed on a mold member 9 having a recess 90, and a fluid paraffin m as a provisional covering material is dripped from a nozzle K4 onto the IC chip 2. The flexible substrate 1A is provided with a plurality of through-holes 12 formed in advance. Thus, the paraffin m flows through the plurality of through-holes below the flexible substrate 1. As a result, the paraffin m is applied to the opposite surfaces of the flexible substrate 1 as shown in FIG. 17, and then solidifies in this state by natural cooling, so that the opposite surfaces of the flexible substrate 1 are covered with the paraffin m at the portion where the IC chip 2 is mounted. Then, after interposing the flexible substrate 1 between a pair of mold members 91a, 91b for arrangement within a cavity 92, a resin package is molded, as shown in FIG. 18. When a phenolic resin for forming the resin package 4C is filled in the cavity 92 and then cured by heating, the solidified paraffin m is fluidized and volatilized to penetrate and diffuse into the phenolic resin which has a high permeability. As a result, a hollow portion is formed at a position where the paraffin existed upon molding the phenolic resin, consequently providing an IC-card module Ae.

Since the resin package 4C and the IC chip 2 are held out of contact with each other in the IC-card module Ae, a deforming stress does not directly affect the IC chip 2 even if the resin package 4C is deformed. Moreover, since the resin package 4C covers the opposite surfaces of the flexible substrate 1, it is possible to protect not only the obverse surface of the substrate 1 used for mounting the IC chip 2 but also the reverse surface. In the case where the resin package 4C is formed of a phenolic resin, the mechanical strength of the resin package may be lower than that of a protective cap made of PET or ABS resin. To solve this problem, the resin package 4C may be covered with another synthetic resin having a higher hardness.

Figure 19:
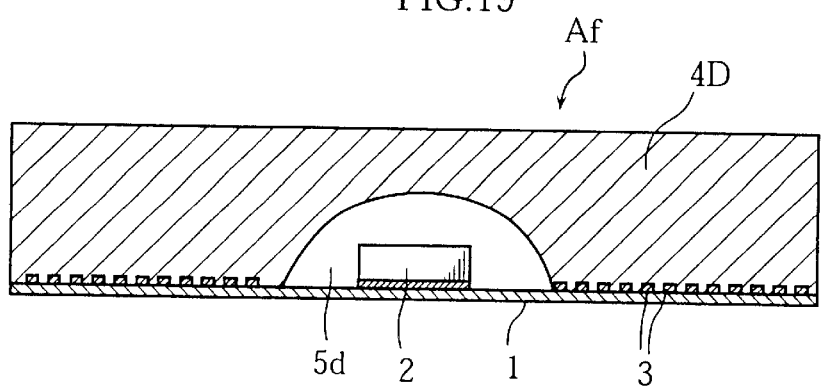
FIG. 19 is a sectional view showing a further example of IC-card module embodying the present invention.

Referring to FIG. 19, an IC-card module Af is shown wherein an IC chip 2 is housed in a resin package 4D attached to only one surface of the substrate 1. The resin package 4D is formed with a hollow portion 5d so as to provide a clearance between the resin package 4D and the IC chip 2.

Figure 20:
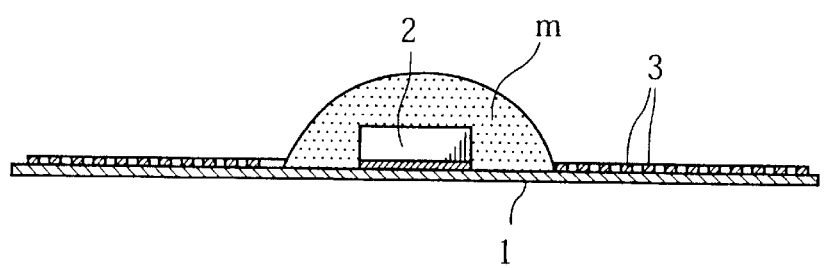
FIG. 20 is a sectional view showing a step of fabricating the IC-card module shown in FIG. 19.
Figure 21:
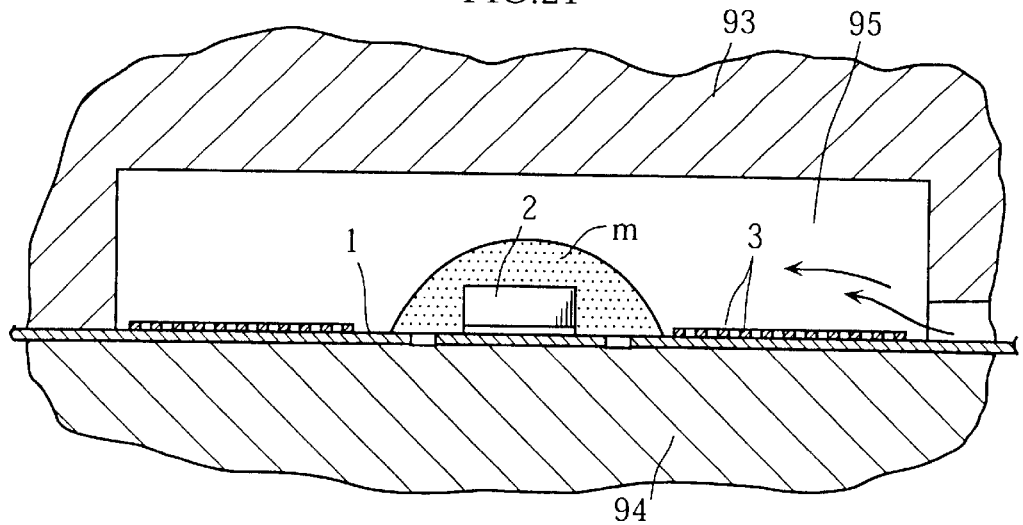
FIG. 21 is a sectional view showing another step of fabricating the IC-card module shown in FIG. 19.

For making such an IC-card module Af, a paraffin m is dripped only to the upper surface of the flexible substrate 1 to cover the IC chip 2, as shown in FIG. 20. Then, as shown in FIG. 21, a resin package 4D is molded with the use of mold members 93, 94 defining a cavity 95. Similarly to the manufacturing process for the IC-card module Ae described before, a hollow portion is formed at a position where the paraffin m existed due to penetration of the paraffin m into the resin package 4D, consequently providing IC-card module Af.

With the IC-card module Af, the IC chip 2 is protected by the resin package 4D. In this way, the present invention is applicable not only to a structure wherein the opposite surfaces of the flexible substrate 1 are covered by a resin package, but also to another structure wherein only one surface of the substrate may be covered by a resin package.

Figure 22:
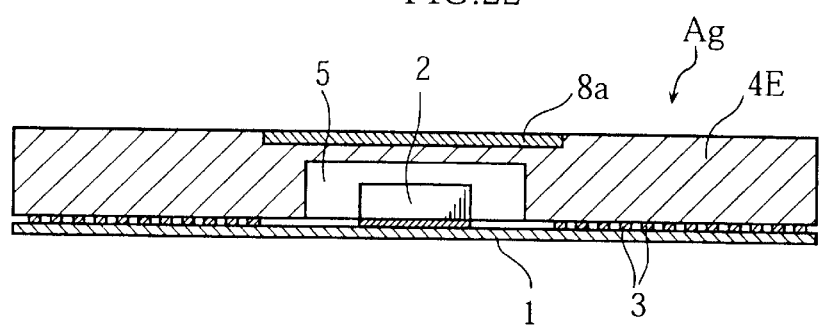
FIG. 22 is a sectional view showing still another example of IC-card module embodying the present invention.

Referring to FIG. 22, an IC-card module Ag is shown wherein a protective cap 4E is provided with a reinforcing member 8a in the form of a plate embedded therein. The reinforcing member 8a is disposed in opposed relationship to the IC chip 2.

Figure 23:
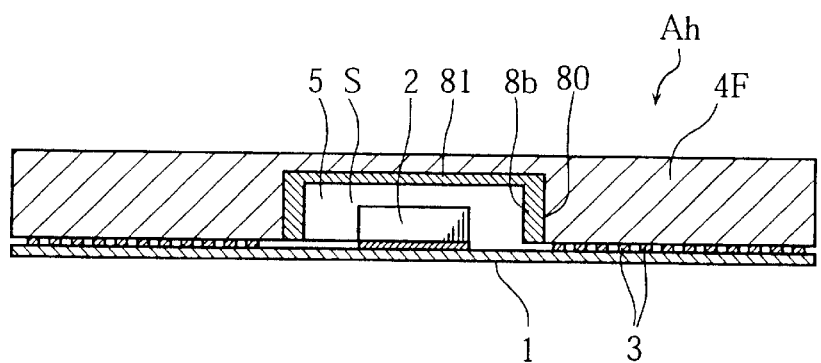
FIG. 23 is a sectional view showing a still further example of IC-card module embodying the present invention.

FIG. 23 shows an IC-card module Ah wherein a reinforcing member 8b is housed in a recess 5 formed in a protective cap 4F. The reinforcing member 8b comprises a ring portion 80 surrounding the IC chip 2 and a plate portion 81 joined to an upper portion of the ring portion 80. The reinforcing member 8b is held out of contact with the IC chip 2 due to a clearance provided therebetween.

Similarly to the IC-card module A described before, the protective cap is prevented from being easily deformed near the IC chip in each of the IC-card modules Ag, Ah, thereby protecting the IC chip 2. Also similarly to the IC-card module A, the reinforcing member 8a or 8b may be embedded in the protective cap 4E or 4F by insert molding.

Figure 24:
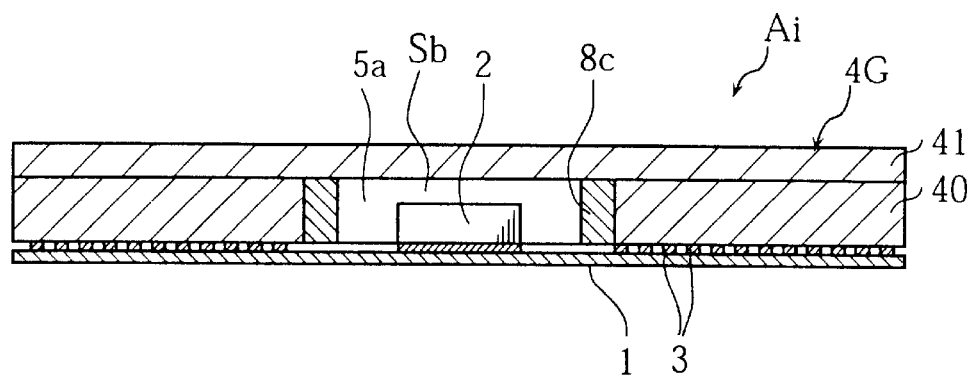
FIG. 24 is a sectional view showing still another example of IC-card module embodying the present invention.
Figure 25:
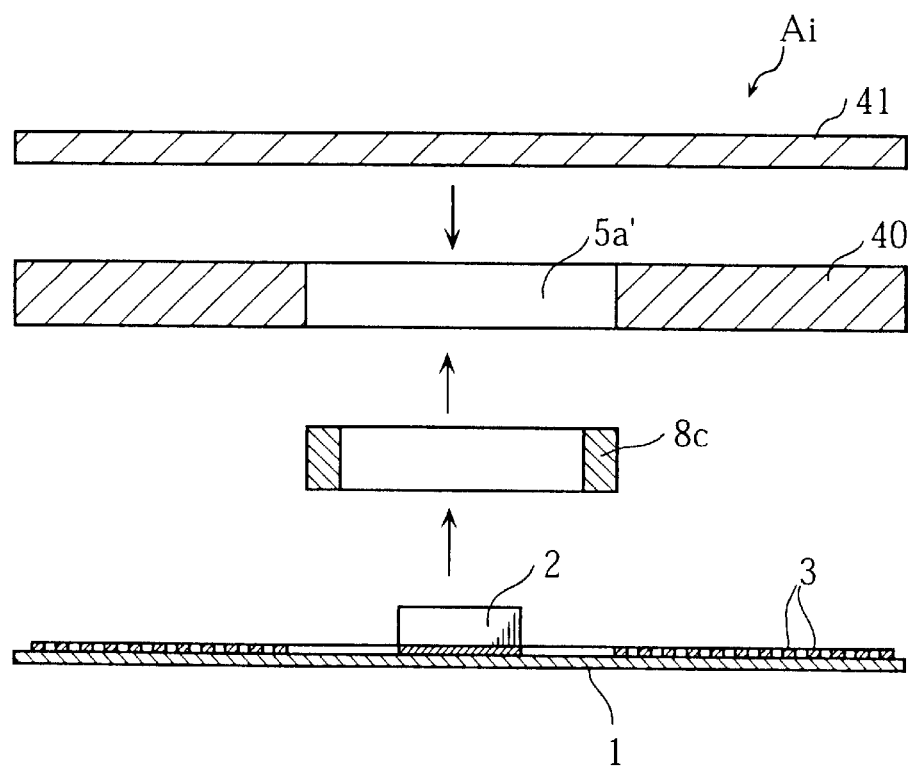
FIG. 25 is an exploded sectional view of the IC-card module shown in FIG. 24.

FIG. 24 illustrates an IC-card module Ai wherein a ring-like reinforcing member 8c is housed in a recess 5a formed in a protective cap 4G so that a clearance Sb is provided between the reinforcing member 8c and the IC chip 2. The protective cap 4G comprises a first sheet member 40 and a second sheet member 41. In making the IC-card module Ai, the first sheet member 40 is perforated to have a through-hole 5a', and the reinforcing member 8 may be simply fitted into the through-hole 5a' to provide an arrangement wherein the reinforcing member 8c is disposed in the recess 5a, as better shown in FIG. 25. With the IC-card module Ai, again, the protective cap 4G and the reinforcing member 8c serve to protect the IC chip 2.

Figure 26:
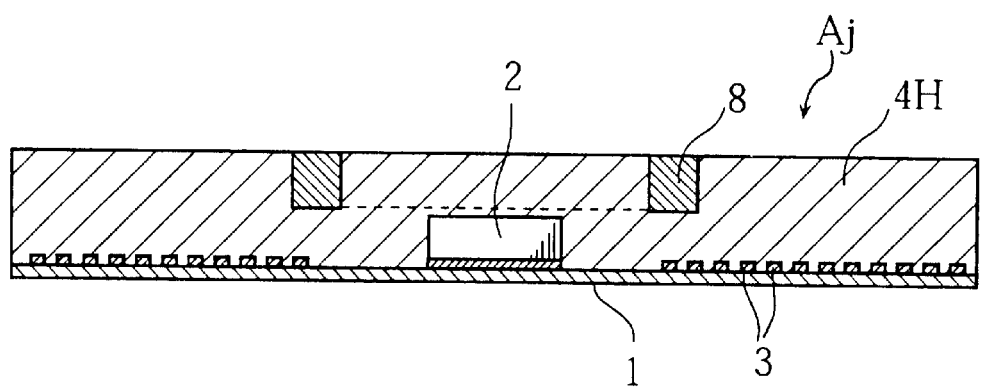
FIG. 26 is a sectional view showing still another example of IC-card module embodying the present invention.

Referring to FIG. 26, an IC-card module Aj is shown wherein an IC chip 2 is housed in a resin package 4H in intimate contact therewith so that no clearance is formed between the IC chip 2 and the resin package 4H. However, in this IC-card module Aj, the resin package 4H is prevented from being deformed near the IC chip due to a reinforcing member 8 embedded in the resin package 4H, thereby protecting the IC chip 2. Thus, in accordance with the present invention, a clearance between the IC chip and the protective member may be dispensed with.

Figure 27:
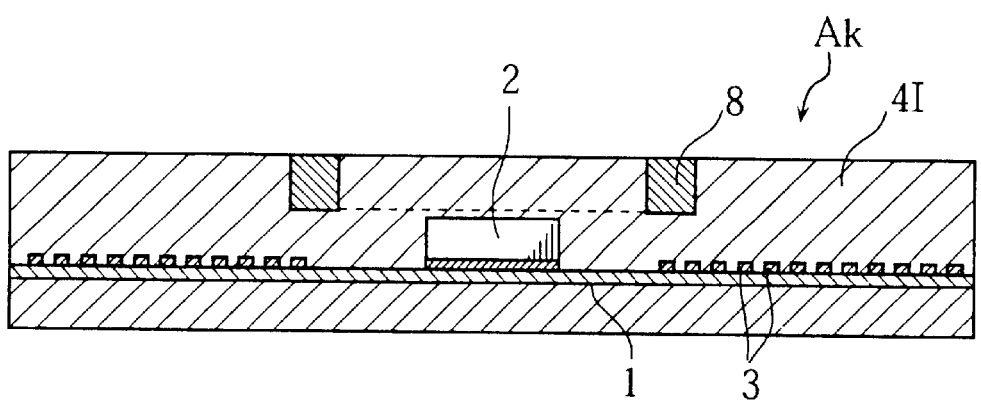
FIG. 27 is a sectional view showing still another example of IC-card module embodying the present invention.

Referring to FIG. 27, an IC-card module Ak is shown wherein a resin package 4I is held in intimate contact with an IC chip 2 and provided with a reinforcing member 8 embedded therein similarly to the IC-card module Aj described above. In this embodiment, however, the resin package 4I covers both surfaces of the flexible substrate 1. Unlike the IC-card modules Ad, Ae described with reference to FIGS. 14 and 15, the resin package in the IC-card module Ak is not formed with a recess confronting the reverse surface of the IC chip 2. Such a structure is also covered by the present invention.

Figure 28:
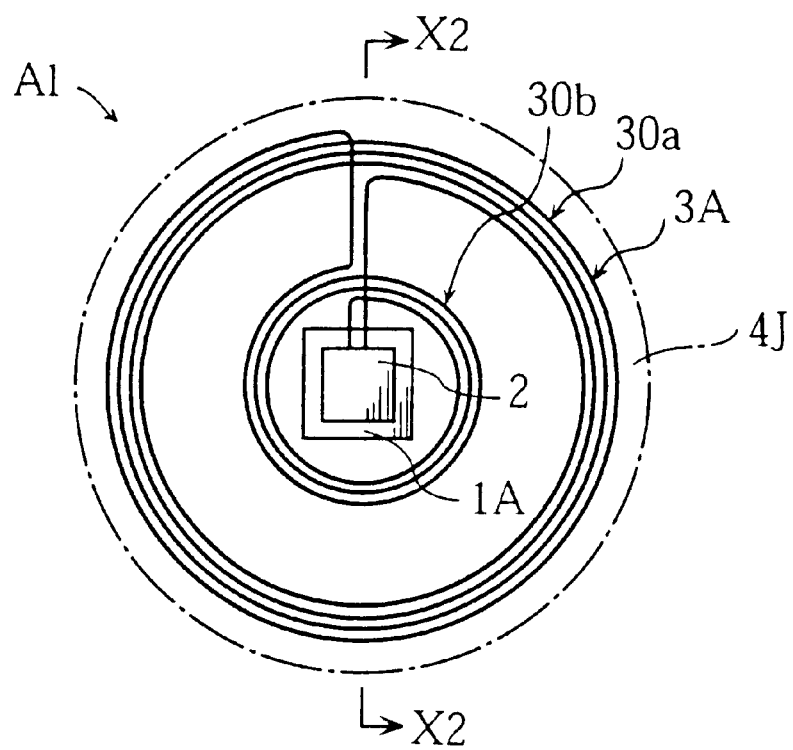
FIG. 28 is a plan view showing still another example of IC-card module embodying the present invention.
Figure 29:
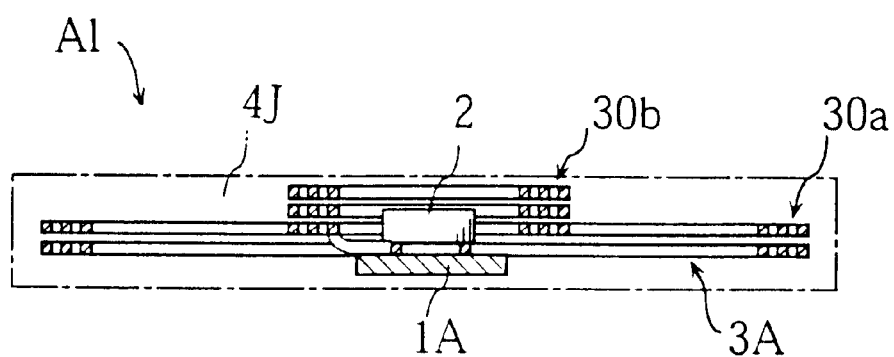
FIG. 29 is a sectional view taken along lines X2—X2 in FIG. 28.

Referring to FIGS. 28 and 29, an IC-card module Al is shown which is provided with an antenna coil 3A formed of a single continuous metal wire. The antenna coil 3A comprises a winding bundle 30a and a winding bundle 30b having a smaller winding diameter than the winding bundle 30a. The winding bundle 30b is disposed adjacent an IC chip 2 mounted on a substrate 1A so as to surround the outer periphery of the IC chip 2, whereas the winding bundle 30a is configured to have a coil length and a winding diameter suitable for receiving and transmitting predetermined radio waves. The opposite ends of the antenna coil 3A are to the IC chip 2. The antenna coil 3A, the substrate 1A, and the IC chip 2 are enclosed in a common resin package 4J.

Figure 30:
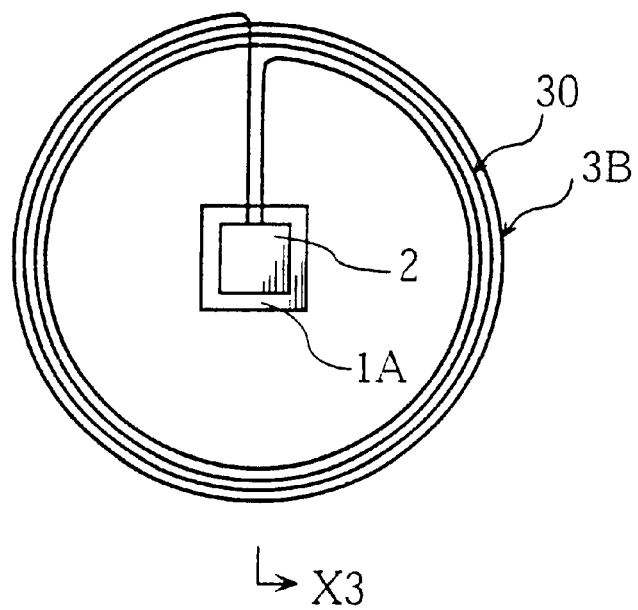
FIG. 30 is a plan view showing a prior antenna coil.
Figure 31:
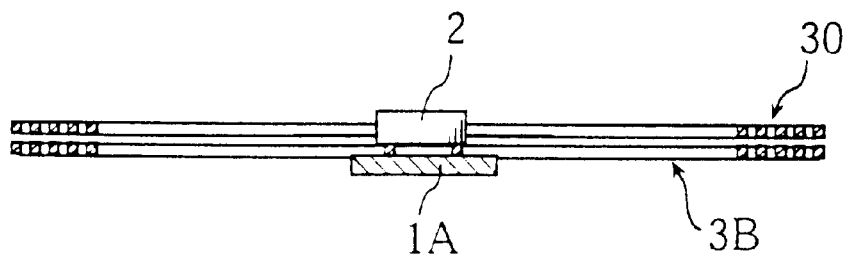
FIG. 31 is a sectional view taken along lines X3—X3 in FIG. 30.

With the IC-card module Al described above, the IC chip 2 is protected by the winding bundle 30b. Further, the strength of the resin package 4J at a portion near the IC chip 2 is enhanced by the winding bundle 30b, thereby preventing the resin package 4J from being easily deformed adjacent the portion where the IC chip 2 is mounted. As shown in FIGS. 30 and 31, a conventional antenna coil 3B comprises a single winding bundle of a relatively large winding diameter only in view of the characteristics for transmitting/receiving radio waves. Accordingly, the antenna coil 3B fails to provide an effective reinforcement for a portion near the IC chip 2. On the other hand, in the IC-card module Al described above, the IC chip 2 can be protected by the antenna coil 3A. Further, the diametrically larger winding bundle 30*a* of the antenna coil 3A prevents a degradation in its inherent communicating.

According to the present invention, the specific structure of the IC-card module and of the components of the IC-card is not necessarily limited to the embodiments described above. Although a flexible substrate is employed as a substrate in the embodiments, the present invention is not limited thereto. A non-flexible hard substrate may be used as a substrate.

According to the present invention, the material for protective member covering the IC chip is not limited to a synthetic resin. The entire protective member may be formed of a metal or a ceramic material having a higher hardness than the material forming the card body of the IC-card. With such a structure, the protective member itself becomes less likely to be deformed, which is advantageous for protecting the IC chip.

INDUSTRIAL APPLICABILITY

An IC-card module in accordance with the present invention may be used as a component of an IC-card. The IC-card of the present invention may be used as a conveniently portable storage medium for storing various data. A method of making an IC-card module in accordance with the present invention may be used for making the IC-card module.

What is claimed is:

1. An IC-card comprising a card member and an IC-card module accommodated within the card member, the IC-card module comprising: a substrate smaller than the card member, an IC chip mounted on the substrate in contact therewith, and a protective member mounted on the substrate for enclosing the IC chip, the protective member being separate from the card member;

wherein the protective member comprises an accommodating space defined by inner wall surfaces, the IC chip being received in the accommodating space and spaced from the inner wall surfaces of the protective member.

2. The IC-card according to claim 1, wherein the substrate comprises a flexible synthetic resin film as a base material.

3. The IC-card according to claim 2, wherein the substrate is provided with an antenna coil for radio communication of electrical signals processed by the IC chip.

4. The IC-card according to claim 1, wherein the protective member comprises a protective cap in the form of a plate or a sheet formed with a recess on a surface thereof opposed to the substrate to serve as the accommodating space for housing the IC chip.

5. The IC-card according to claim 4, wherein the protective cap is formed by molding a resin.

6. The IC-card according to claim 4, wherein the protective cap comprises a first sheet member having a through-hole, and a second sheet member separate from the first sheet member, the second sheet member being laminated and bonded to the first sheet member, an opening of the through-hole being closed by the second sheet member to provide the recess.

7. The IC-card according to claim 1, wherein the protective member comprises a resin-package enclosing the IC chip without contacting the IC chip.

8. The IC-card according to claim 1, wherein the protective member covers opposite surfaces of the substrate at a portion thereof on which the IC chip is mounted.

9. The IC-card according to claim 1, wherein the accommodating space of the protective member is loaded with a filler having a lower modulus of elasticity than the protective member.

10. The IC-card according to claim 9, wherein the filler comprises a material which is curable at room temperature.

11. The IC-card according to claim 1, wherein the accommodating space of the protective member is held in an oxygen-free atmosphere.

12. The IC-card according to claim 11, wherein the accommodating space of the protective member is filled with an inert gas.

13. The IC-card according to claim 1, further comprising a reinforcing member which is harder than the protective member for reinforcing the protective member around the IC chip.

14. The IC-card according to claim 1, wherein the protective member is formed of a metal or a ceramic material.

15. The IC-card according to claim 1, wherein the card member comprises a card body having a receiving portion in the form of a recess or a through-hole for housing the IC-card module, and at least one cover sheet bonded to the card body to close an opening of the receiving portion.

16. A method of making an IC-card module comprising:

a first step of covering an IC chip mounted on a substrate with a covering material;

a second step of packaging the IC chip in a resin package over the covering material;

wherein the second step includes liquefying or gasifying the covering material for penetration into the resin-package before the resin-package is cured so that an accommodating space larger than the IC chip is formed for housing the IC chip, the accommodating space being unoccupied by resin.

17. the method of making an IC-card module according to claim 16, wherein:

the first step includes covering, with the covering material, opposite surfaces of the substrate at a portion thereof on which the IC chip is mounted;

the second step including resin-packaging the opposite surfaces o the substrate at the chip mounting portion so that the accommodating space extends across the substrate.

18. The method of making an IC-card module according to claim 17, wherein the substrate has a through-hole formed in advance;

the first step including supplying the covering material in a fluid state to an obverse surface of the substrate and causing the covering material to flow through the through-hole to a reverse surface of the substrate so that the covering material is applied to both of the opposite surfaces of the substrate at the chip mounting portion.

19. An IC-card module comprising:

a substrate, conductors formed on the substrate;

an IC chip mounted on the substrate in electrical connection to the conductors;

a protective member mounted on the substrate for enclosing the IC chip; and a reinforcing member provided on the protective member and spaced from the conductors, the reinforcing member being harder than the protective member for reinforcing the protective member around the IC chip, the reinforcing member being located closer to the IC chip than a peripheral portion of the protective member.

20. The IC-card module according to claim 18, wherein the substrate comprises a flexible synthetic resin film as a base material.

21. The IC-card module according to claim 18, wherein the protective member is formed of a synthetic resin, the reinforcing member being formed of a metal or a ceramic material.

22. The IC-card module according to claim 18, wherein the protective cap is formed by molding a resin, the reinforcing member being embedded in the protective member by insert molding.

23. The IC-card module according to claim 18, wherein the protective member is provided with a recess for housing the IC chip, the reinforcing member including a ring-like member or portion fitted in the recess to surround the IC chip.

24. An IC-card comprising a card member and an IC-card module accommodated within the card member, the IC-card module comprising: a substrate smaller than the card member; conductors formed on the substrate; an IC chip mounted on the substrate in contact therewith for electrical connection to the conductors; a protective member mounted on the substrate for enclosing the IC chip, the protective member being provided separately from the card member; and a reinforcing member provided on the protective member and spaced from the conductors, the reinforcing member being harder than the protective member for reinforcing the protective member around the IC chip.

25. The IC-card according to claim 24, wherein the card member comprises a card body having a receiving portion in the form of a recess or a through-hole for housing the IC-card module, and at least one cover sheet bonded to the card body to close an opening of the receiving portion.

* * * * *